(12) United States Patent
Noma (10) Patent No.: US 8,848,455 B2
(45) Date of Patent: Sep. 30, 2014

(54) NONVOLATILE MEMORY DEVICE AND METHOD FOR MANUFACTURING THE SAME

(75) Inventor: Kenji Noma, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 261 days.

(21) Appl. No.: 13/236,853

(22) Filed: Sep. 20, 2011

(65) Prior Publication Data

US 2012/0195116 A1 Aug. 2, 2012

(30) Foreign Application Priority Data

Jan. 31, 2011 (JP) ................................. 2011-017708

(51) Int. Cl.
| | |
|---|---|
| *G11C 11/34* | (2006.01) |
| *H01L 29/788* | (2006.01) |
| *H01L 27/22* | (2006.01) |
| *H01L 27/115* | (2006.01) |
| *G11C 11/16* | (2006.01) |
| *H01L 29/66* | (2006.01) |
| *H01L 21/28* | (2006.01) |
| *G11C 13/00* | (2006.01) |
| *G11C 16/04* | (2006.01) |
| *G11C 29/00* | (2006.01) |
| *G11C 11/00* | (2006.01) |

(52) U.S. Cl.
CPC ............ *G11C 11/16* (2013.01); *H01L 29/7881* (2013.01); *G11C 13/0002* (2013.01); *H01L 27/222* (2013.01); *G11C 16/04* (2013.01); *H01L 27/11526* (2013.01); *H01L 29/66825* (2013.01); *G11C 29/789* (2013.01); *G11C 11/005* (2013.01); *H01L 21/28273* (2013.01)
USPC .................. 365/185.29; 365/158; 365/185.25

(58) Field of Classification Search
CPC ............. G11C 13/0011; G11C 13/004; G11C 13/0069; G11C 2013/0054; G11C 5/147; G11C 7/04; H01L 21/28273
USPC ............. 365/185.01, 185.03, 185.05, 185.18, 365/185.24, 185.25, 185.29, 158, 148, 365/171–173; 257/E29.255, 314, E21.665, 257/E21.422, E29.309, 324, 326, E21.423
See application file for complete search history.

(56) References Cited

U.S. PATENT DOCUMENTS

2006/0092738 A1* 5/2006 Kang et al. ..................... 365/210
2010/0321995 A1* 12/2010 Sarin .......................... 365/185.2

FOREIGN PATENT DOCUMENTS

| JP | 2006-210718 | 8/2006 |
|---|---|---|
| JP | 2008-78663 | 4/2008 |
| JP | 2009-163843 | 7/2009 |

* cited by examiner

*Primary Examiner* — Hien Nguyen
(74) *Attorney, Agent, or Firm* — Oblon, Spivak, McClelland, Maier & Neustadt, L.L.P.

(57) ABSTRACT

According to one embodiment, a method is disclosed for manufacturing a nonvolatile memory device. The method can include forming a second stacked body, removing the second stacked body formed in a region where a first memory unit will be formed, forming a first stacked body, and removing the first stacked body formed in a region where a second memory unit will be formed. The method can include simultaneously processing the first stacked body formed in a region where the first memory unit will be formed and the second stacked body formed in a region where the second memory unit will be formed to form a memory cell of the first memory unit from the first stacked body and form a memory cell of the second memory unit from the second stacked body.

6 Claims, 12 Drawing Sheets

FIG. 12B

NONVOLATILE MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2011-017708, filed on Jan. 31, 2011; the entire contents of which are incorporated herein by reference.

FIELD

Embodiments described herein relate generally to a nonvolatile memory device and method for manufacturing the same.

BACKGROUND

In the manufacture of large-capacity memory devices, the occurrence of a defective bit due to the memory principle and the variation in processes cannot be avoided. In this regard, a nonvolatile memory device is proposed that includes a main memory and a supplementary memory that stores the position information of a defective bit in the main memory etc., prohibits using the defective bit identified, and uses an alternative bit.

Here, in those cases where a nonvolatile memory device is mounted, the nonvolatile memory device may be temporarily exposed to a high temperature.

For example, the semiconductor chip of a nonvolatile memory device, LSI, etc. is electrically connected to the external circuit through an operation called solder reflow during mounting. In the solder reflow process, since lead-free solder is used as a bonding material, the whole circuit including the semiconductor chip is generally heated to about 250° C. to 260° C. by infrared (IR) heating. There is also a reflow method in which only the electrode of the connection portion is exceptionally heated by ultrasonic heating or laser heating to suppress the increase in the temperature of the semiconductor chip portion. However, since infrared heating is much more excellent in mass productivity and the reliability of the joint portion, the reflow method using infrared heating is most widely used.

In the case where the nonvolatile memory device is thus temporarily exposed to a high temperature, if the information stored in the supplementary memory is undesirably erased, it becomes necessary to perform another electrical characteristic test to identify the defective bit and store the position information of the defective bit etc. into the supplementary memory again.

In view of this, a nonvolatile memory device is proposed that includes a supplementary memory having a data erase temperature higher than the data erase temperature of the main memory.

However, since the configuration of the main memory and the configuration of the supplementary memory are different, the productivity may be reduced.

DETAILED DESCRIPTION

In general, according to one embodiment, a method is disclosed for manufacturing a nonvolatile memory device. The nonvolatile memory device can include a first memory unit and a second memory unit having a data erase temperature higher than a data erase temperature of the first memory unit. The method can include forming a second stacked body for forming a memory cell of the second memory unit. The method can include removing the second stacked body formed in a region where the first memory unit will be formed. The method can include forming a first stacked body for forming a memory cell of the first memory unit. The method can include removing the first stacked body formed in a region where the second memory unit will be formed. The method can include simultaneously processing the first stacked body formed in a region where the first memory unit will be formed and the second stacked body formed in a region where the second memory unit will be formed to form a memory cell of the first memory unit from the first stacked body and form a memory cell of the second memory unit from the second stacked body.

Various embodiments will be described hereinafter with reference to the accompanying drawings. In the drawings, like components are marked with the same reference numerals and a detailed description thereof is omitted as appropriate.

First Embodiment

Figure 1:
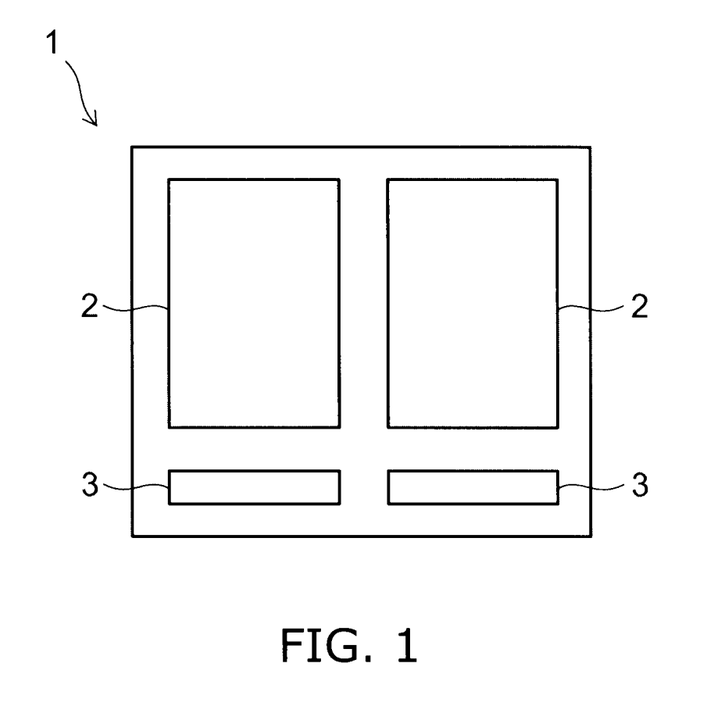
FIG. 1 is a schematic view for illustrating a nonvolatile memory device according to a first embodiment.

FIG. 1 is a schematic view for illustrating a nonvolatile memory device according to a first embodiment.

As shown in FIG. 1, a nonvolatile memory device 1 includes a first memory unit 2 and a second memory unit 3. A not-shown peripheral circuit unit and the like may be provided as appropriate.

The first memory unit 2 is a main memory that stores desired information as information of digital bits and allows the stored information to be read out.

The second memory unit 3 is a supplementary memory for storing the position information of a defective bit in the first memory unit 2 and the like.

In the nonvolatile memory device 1, the defective bit identified based on the position information of the defective bit and the like stored in the second memory unit 3 is prohibited from being used, and an alternative bit is used.

The first memory unit 2 may be, for example, a spin injection MRAM (magnetoresistive random access memory) that is a resistance change nonvolatile memory element or the like.

The second memory unit 3 is configured to have a data erase temperature higher than the data erase temperature of the first memory unit 2.

For example, in the case where a spin injection MRAM is used as the first memory unit 2, the second memory unit 3 may be a charge storage nonvolatile memory element such as a flash memory, a current programming magnetoresistive effect memory, a high heat resistance ReRAM (resistance random access memory), or the like.

Figure 2A:
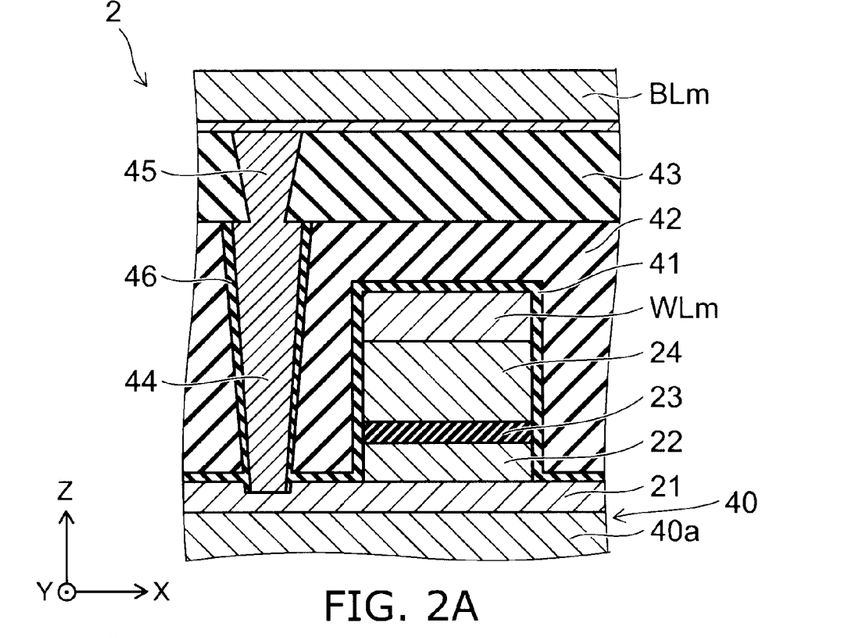
FIG. 2A is a schematic cross-sectional view illustrating the configuration of a spin injection MRAM as the first memory unit 2.

In this case, in the first memory unit 2, for example, a configuration may be used in which the first magnetic layer 22 described later is a stacked film in which a film using TbCoFe and a film using CoFeB are stacked in this order from the conductive film 21 side, the nonmagnetic layer 23 is a film using magnesium oxide (MgO), and the second magnetic layer 24 is a stacked film in which a film using CoFeB and a film using TbCoFe are stacked in this order from the nonmagnetic layer 23 side. Thereby, a data erase temperature of about 200° C. is obtained. In this case, the effect of the material of the first magnetic layer 22 and the second magnetic layer 24 on the data erase temperature is greater than the effect of the material of the nonmagnetic layer 23 on the data erase temperature.

Figure 2B:
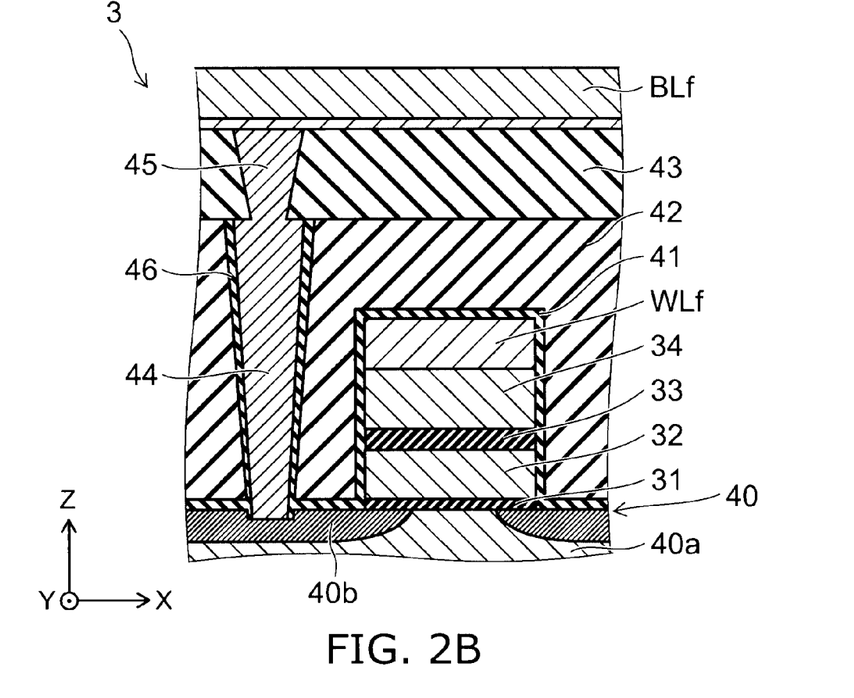
FIG. 2B is a schematic cross-sectional view illustrating the configuration of a flash memory as the second memory unit 3.

In the case where, for example, the flash memory described later is used as the second memory unit 3, a data erase temperature of 260° C. or more can be obtained.

Furthermore, in the case where, for example, an MRAM using perpendicular magnetization is used as the second memory unit 3, a film using FePt is used as the first magnetic layer and the second magnetic layer, and a film using magnesium oxide (MgO) is used as the nonmagnetic layer, a data erase temperature of about 400° C. can be obtained.

Furthermore, in the case where, for example, an MRAM using in-plane magnetization is used as the second memory unit 3, a film using CoFe is used as the first magnetic layer and the second magnetic layer, and a film using magnesium oxide (MgO) is used as the nonmagnetic layer, a data erase temperature of 260° C. or more can be obtained.

FIGS. 2A and 2B are schematic cross-sectional views for illustrating the configuration of the first memory unit and the second memory unit.

FIG. 2A is a schematic cross-sectional view illustrating the configuration of a spin injection MRAM as the first memory unit 2, and FIG. 2B is a schematic cross-sectional view illustrating the configuration of a flash memory as the second memory unit 3. A plurality of memory cells are provided in the first memory unit and the second memory unit, but herein the portion of one memory cell is described as an example.

As shown in FIG. 2A, in the first memory unit 2, a conductive film 21, a first magnetic layer 22, a nonmagnetic layer 23, and a second magnetic layer 24 are provided to be stacked in this order on a p-type silicon region 40a formed in an upper portion of a silicon substrate 40.

The conductive film 21 extends in the X direction on the lower side of the first magnetic layer 22. The conductive film 21 may be made of, for example, a metal or the like.

The first magnetic layer 22 and the second magnetic layer 24 may be formed using, for example, a transition metal magnetic element such as iron (Fe) and nickel (Ni), an alloy of them (e.g., NiFe etc.), or the like.

In this case, the first magnetic layer 22 and the second magnetic layer 24 may be a stacked film in which films using different materials are stacked. For example, the first magnetic layer 22 and the second magnetic layer 24 may be a stacked film in which a film using TbCoFe and a film using CoFeB are stacked. The first magnetic layer 22 may be a stacked film in which a film using TbCoFe and a film using CoFeB are stacked in this order from the conductive film 21 side. The second magnetic layer 24 may be a stacked film in which a film using CoFeB and a film using TbCoFe are stacked in this order from the nonmagnetic layer 23 side.

The nonmagnetic layer 23 may be formed using, for example, magnesium oxide (MgO) or the like.

A word line WLm extending in the Y direction is provided on the second magnetic layer 24. The word line WLm may be formed using, for example, copper, tungsten, tungsten silicide, aluminum, or the like.

A protection film 41, an interlayer insulating film 42, an insulating film 43, and a bit line BLm are provided to be stacked in this order.

Furthermore, a contact 44 and a contact 45 connecting the bit line BLm and the conductive film 21 are provided.

The contact 44 and the contact 45 may be formed using, for example, a metal such as tungsten (W).

The protection film 41 and the insulating film 43 may be formed using, for example, silicon nitride or the like. The interlayer insulating film 42 may be formed using, for example, silicon oxide or the like.

A protection film 46 is formed on the outer peripheral surface of the contact 44. The protection film 46 may be formed using, for example, silicon nitride or the like.

The bit line BLm extends in the X direction and may be formed using, for example, copper, tungsten, tungsten silicide, aluminum, or the like. The contact 44 and the contact 45 may be formed using, for example, copper, tungsten, tungsten silicide, aluminum, or the like.

Here, the first magnetic layer 22 and the second magnetic layer 24 have a direction of magnetization. When the directions of the magnetizations of them in the Z direction are the same, the resistance value decreases. When the directions of the magnetizations of them in the Z direction are opposite, the resistance value increases. This is referred to as the tunneling magnetic effect.

The first memory unit 2 is a spin injection MRAM in which a difference in the resistance value is stored as information of digital bits and the stored information is read out by measuring the change in the resistance value.

As shown in FIG. 2B, in the second memory unit 3, a tunnel gate insulating film 31, a floating gate 32, an inter-gate insulating film 33, and a control gate 34 are provided to be stacked in this order on the p-type silicon region 40a formed in an upper portion of the silicon substrate 40. A source/drain region 40b using, for example, an n-type diffusion layer is provided on both sides in the X direction of the floating gate 32.

The tunnel gate insulating film 31 may be formed using, for example, silicon oxide or the like.

The floating gate 32 may be formed using, for example, polysilicon or the like.

The inter-gate insulating film 33 may be formed using, for example, silicon oxynitride or the like.

The control gate 34 may be formed using, for example, polysilicon or the like.

Furthermore, similarly to the first memory unit 2 illustrated in FIG. 2A, a word line WLf, the protection film 41, the interlayer insulating film 42, the insulating film 43, the protection film 46, and a bit line BLf are provided. The word line WLf is provided on the control gate 34 and extends in the Y direction. The contact 44 and the contact 45 connect the bit line BLf and the source/drain region 40b.

The second memory unit 3 is a flash memory in which a charge traped in the floating gate 32 via the tunnel gate insulating film 31 is stored as information of digital bits and the stored information is read out by measuring the conductance change in accordance with the charge amount.

In this embodiment, the second memory unit 3 has a data erase temperature higher than the data erase temperature of the first memory unit 2. Therefore, undesirable erasure of the information stored in the second memory unit 3 can be suppressed even if the nonvolatile memory device 1 is temporarily exposed to a high temperature in those cases where the nonvolatile memory device 1 is mounted.

Furthermore, the first memory unit 2 and the second memory unit 3 can be manufactured almost simultaneously even if the configuration of the first memory unit 2 and the configuration of the second memory unit 3 are different. Therefore, the increase in productivity can be suppressed.

For example, in those cases where an MRAM is used as the first memory unit 2 and a flash memory is used as the second memory unit 3, although the materials of the layers are different, the first memory unit 2 and the second memory unit 3 can be manufactured almost simultaneously because the stack structures themselves are similar.

In this case, since the cell size in the first memory unit 2 and the cell size in the second memory unit 3 can be made approximately equal, the exposure condition in the PEP (photoengraving process), the etching condition, and the like can be made the same. Consequently, it becomes easy to simultaneously form the memory cells in the first memory unit 2 and the second memory unit 3.

Details regarding manufacturing the first memory unit 2 and the second memory unit 3 almost simultaneously are described later.

Second Embodiment

FIG. 3A to FIG. 12B are schematic process cross-sectional views for illustrating a method for manufacturing a nonvolatile memory device according to a second embodiment.

In the drawings, the right side shows the manner in which a spin injection MRAM is formed as the first memory unit 2, and the left side shows the manner in which a flash memory is formed as the second memory unit 3.

The manufacturing method according to this embodiment manufactures the first memory unit 2 and the second memory unit 3 almost simultaneously. Hence, a detailed description is omitted in regard to the processes of separately fabricating the memory array unit and the peripheral circuit unit and the like.

Figure 3A:
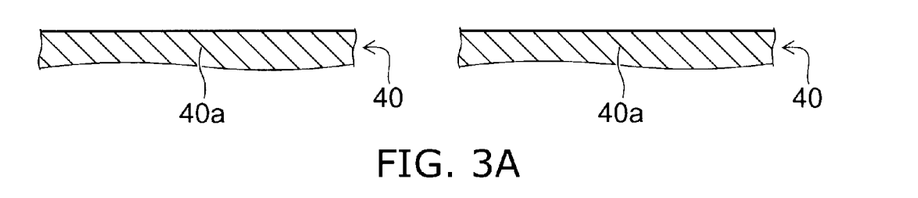
FIG. 3A to FIG. 3C are schematic process cross-sectional views for illustrating a method for manufacturing a nonvolatile memory device according to a second embodiment.

As shown in FIG. 3A, an impurity is introduced into the silicon substrate 40 from the upper surface side thereof to form a not-shown n-type silicon region, and then an impurity is introduced into part of the upper portion of the n-type silicon region to form the p-type silicon region 40a.

Figure 3B:
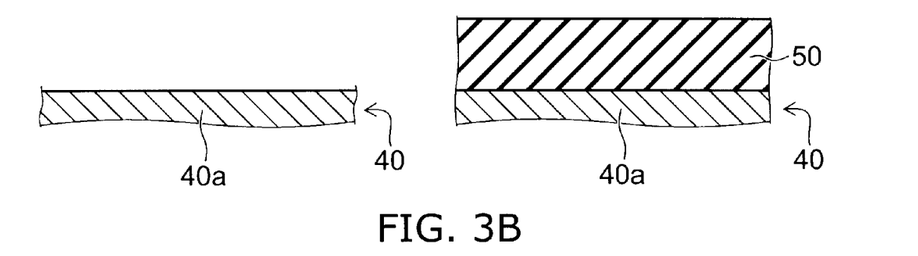

Next, as shown in FIG. 3B, a protection film 50 is formed in a region where the spin injection MRAM will be formed. A resist film or the like, for example, may be used as the protection film 50.

Figure 3C:
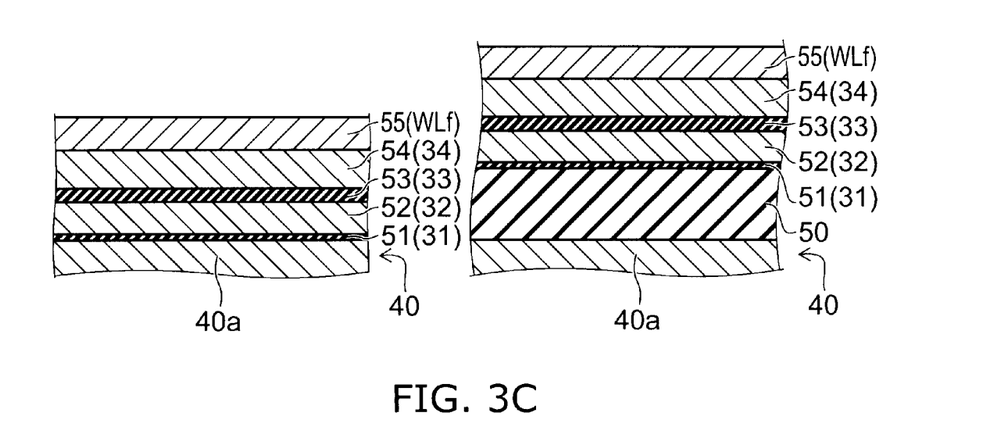

Next, as shown in FIG. 3C, a stacked body (corresponding to an example of a second stacked body) for forming the memory cell of the flash memory is formed. For example, films 51 to 55 that form the tunnel gate insulating film 31, the floating gate 32, the inter-gate insulating film 33, the control gate 34, and the word line WLf are sequentially formed using the CVD (chemical vapor deposition) method or the like to form a stacked body.

The film 51 that forms the tunnel gate insulating film 31 can be formed by, for example, processing silicon oxide or the like into a film with a prescribed thickness.

The film 52 that forms the floating gate 32 can be formed by, for example, processing polysilicon or the like into a film with a prescribed thickness.

The film 53 that forms the inter-gate insulating film 33 can be formed by, for example, processing silicon oxynitride or the like into a film with a prescribed thickness.

The film 54 that forms the control gate 34 can be formed by, for example, processing polysilicon or the like into a film with a prescribed thickness.

The film 55 that forms the word line WLf can be formed by, for example, processing copper, tungsten, tungsten silicide, aluminum, or the like into a film with a prescribed thickness.

Here, in the process of forming the stacked body for forming the memory cell of the flash memory, there is a case where film-formation is performed at a high temperature. As a consequence, if a stacked body (corresponding to an example of a first stacked body) for forming the memory cell of the spin injection MRAM described later is formed earlier and after that the stacked body for forming the memory cell of the flash memory is formed, the characteristics of the spin injection MRAM may be degraded.

In view of this, in this embodiment, the stacked body for forming the memory cell of the flash memory is formed earlier.

Next, the CVD method, the PEP, and the like may be used to form a not-shown peripheral circuit unit and the like.

Figure 4A:
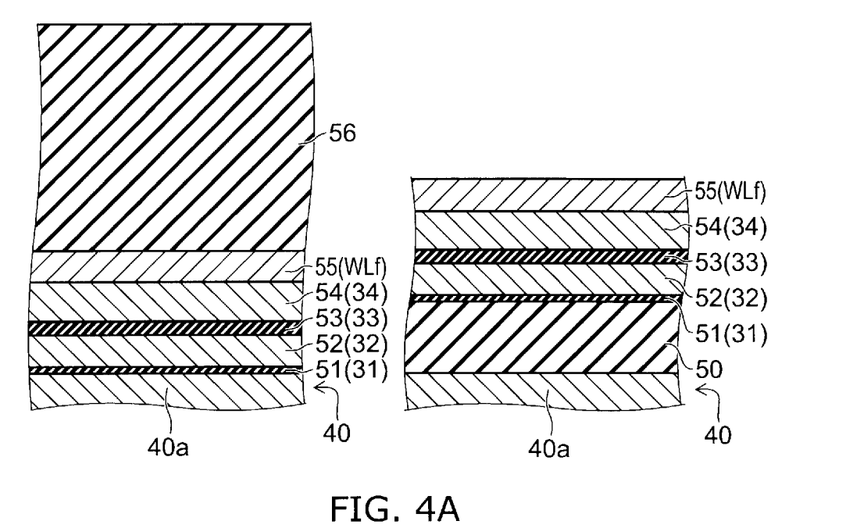
FIG. 4A and FIG. 4B are schematic process cross-sectional views for illustrating a method for manufacturing a nonvolatile memory device according to a second embodiment.

Next, as shown in FIG. 4A, a protection film 56 is formed in a region where the flash memory will be formed. A resist film or the like, for example, may be used as the protection film 56.

Figure 4B:
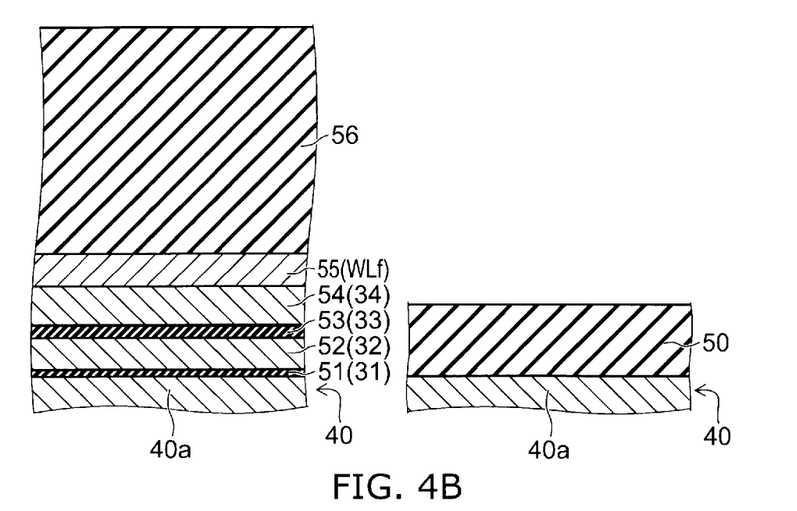

Next, as shown in FIG. 4B, the stacked body (the films 51 to 55) formed in the region other than the region where the flash memory will be formed is removed. For example, the stacked body (the films 51 to 55) formed in the region where the spin injection MRAM will be formed is removed.

The removal of the stacked body (the films 51 to 55) can be performed using, for example, the RIE (reactive ion etching) method or the like.

Also the lift-off method or the like may be used to remove the stacked body (the films 51 to 55). Using the lift-off method eliminates the need for the formation of the protection film 56 illustrated in FIG. 4A.

However, from the viewpoint of suppressing contamination, it is preferable to form the protection film 56 and then use the RIE method or the like to remove the stacked body (the films 51 to 55).

Figure 5A:
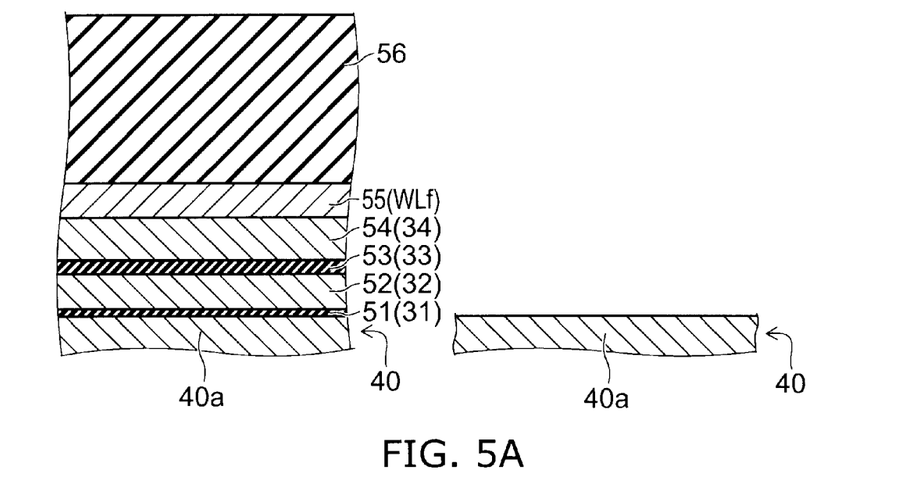
FIG. 5A and FIG. 5B are schematic process cross-sectional views for illustrating a method for manufacturing a nonvolatile memory device according to a second embodiment.

Next, as shown in FIG. 5A, the protection film 50 formed in the region where the spin injection MRAM will be formed is removed.

The removal of the protection film 50 can be performed using, for example, the RIE method, the lift-off method, or the like.

Figure 5B:
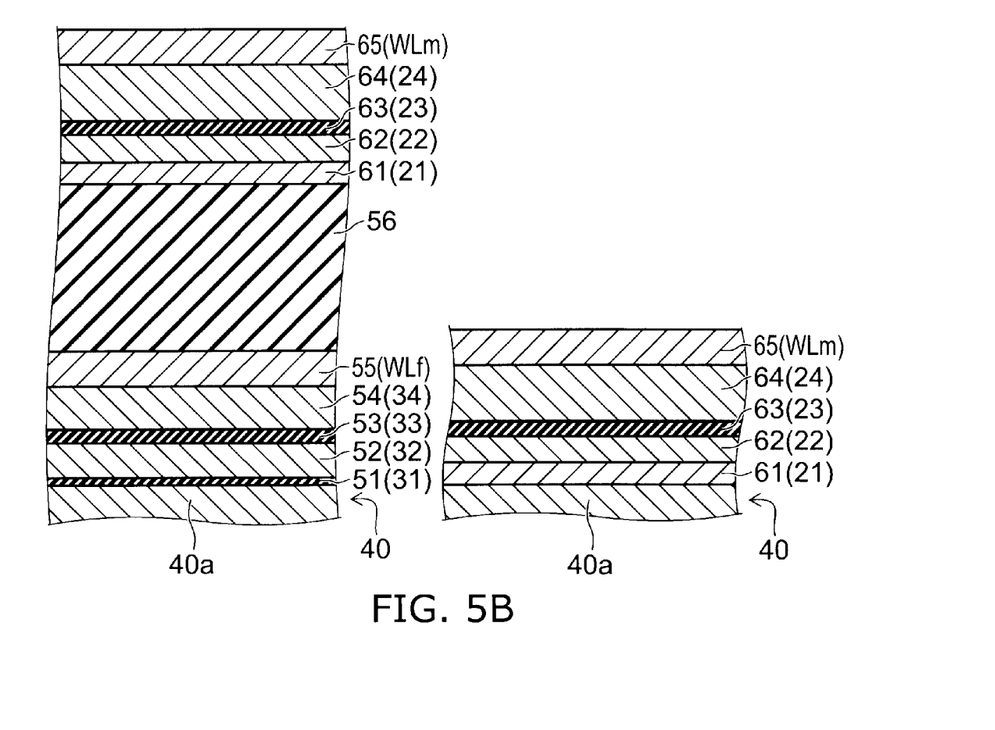

Next, as shown in FIG. 5B, a stacked body for forming the memory cell of the spin injection MRAM is formed. More specifically, the sputtering method or the like is used to sequentially form films 61 to 65 that form the conductive film 21, the first magnetic layer 22, the nonmagnetic layer 23, the second magnetic layer 24, and the word line WLm to form a stacked body.

The film 61 that forms the conductive film 21 can be formed by, for example, processing a metal or the like into a film with a prescribed thickness.

The film 62 that forms the first magnetic layer 22 can be formed by, for example, processing a transition metal magnetic element such as iron (Fe) and nickel (Ni), an alloy of them (e.g., NiFe etc.), or the like into a film with a prescribed thickness. In this case, the film 62 may be configured to be a stacked film in which a film using TbCoFe and a film using CoFeB are stacked in this order from the film 61 side.

The film 63 that forms the nonmagnetic layer 23 can be formed by, for example, processing magnesium oxide (MgO) or the like into a film with a prescribed thickness.

The film 64 that forms the second magnetic layer 24 can be formed by, for example, processing a transition metal magnetic element such as iron (Fe) and nickel (Ni), an alloy of them (e.g., NiFe etc.), or the like into a film with a prescribed thickness. In this case, the film 64 may be configured to be a stacked film in which a film using CoFeB and a film using TbCoFe are stacked in this order from the film 63 side.

The film 65 that forms the word line WLm can be formed by, for example, processing copper, tungsten, tungsten silicide, aluminum, or the like into a film with a prescribed thickness.

Figure 6A:
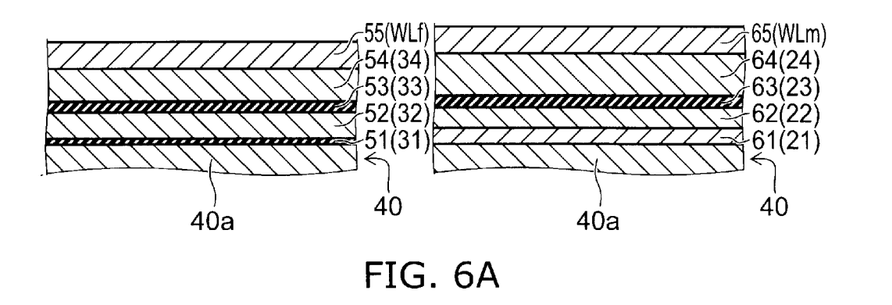
FIG. 6A to FIG. 6C are schematic process cross-sectional views for illustrating a method for manufacturing a nonvolatile memory device according to a second embodiment.

Next, as shown in FIG. 6A, the stacked body (the films 61 to 65) formed in the region other than the region where the spin injection MRAM will be formed is removed. For example, the stacked body (the films 61 to 65) formed in the region where the flash memory will be formed is removed.

The removal of the stacked body (the films 61 to 65) can be performed using, for example, the lift-off method or the like.

By the above method, a stacked body using the films 61 to 65 that form the conductive film 21, the first magnetic layer 22, the nonmagnetic layer 23, the second magnetic layer 24, and the word line WLm can be formed in the region where the spin injection MRAM will be formed. Furthermore, a stacked body using the films 51 to 55 that form the tunnel gate insulating film 31, the floating gate 32, the inter-gate insulating film 33, the control gate 34, and the word line WLf can be formed in the region where the flash memory will be formed.

In the subsequent processes, the process for forming the spin injection MRAM that is the first memory unit 2 and the process for forming the flash memory that is the second memory unit 3 can be simultaneously performed.

Figure 6B:
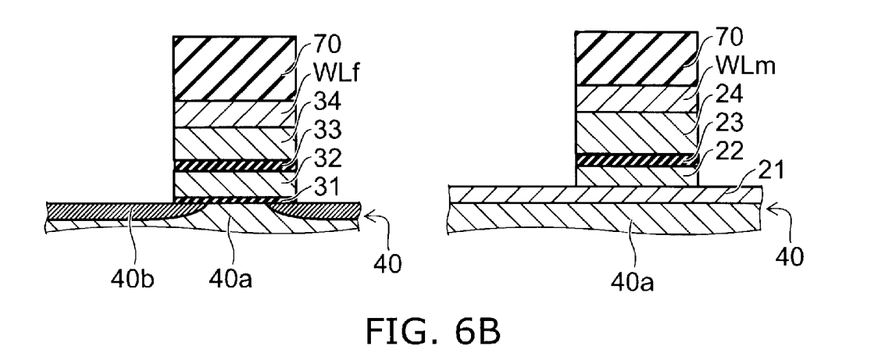

Next, as shown in FIG. 6B, the PEP and the RIE method are used to perform selective removal to form the memory cell of the spin injection MRAM and the memory cell of the flash memory. More specifically, the stacked body (the films 61 to 65) formed in the region where the spin injection MRAM will be formed and the stacked body (the films 51 to 55) formed in the region where the flash memory will be formed are simultaneously processed to form the memory cell of the spin injection MRA from the stacked body (the films 61 to 65) and form the memory cell of the flash memory from the stacked body (the films 61 to 65).

For example, in the spin injection MRAM that is the first memory unit 2, a memory cell that includes the conductive film 21, the first magnetic layer 22, the nonmagnetic layer 23, and the second magnetic layer 24 is formed. In the flash memory that is the second memory unit 3, a memory cell that includes the tunnel gate insulating film 31, the floating gate 32, the inter-gate insulating film 33, and the control gate 34 is formed. In addition, the word line WLm and the word line WLf are formed.

In the flash memory that is the second memory unit 3, an n-type impurity is introduced into both sides of the memory cell formed to form the source/drain region 40b.

"70" in the drawing is a resist mask used during performing selective removal.

In this case, since the cell size in the spin injection MRAM and the cell size in the flash memory can be made approximately equal, the exposure condition in the PEP, the etching condition, and the like can be made the same. Therefore, it becomes easy to simultaneously form the memory cell in the spin injection MRAM and the memory cell in the flash memory.

Furthermore, if a material capable of being used as a stopper during performing the selective removal by the PEP is used as the film 61 formed in the region where the spin injection MRAM will be formed, it becomes even easier to simultaneously form the memory cell in the spin injection MRAM and the memory cell in the flash memory.

Figure 6C:
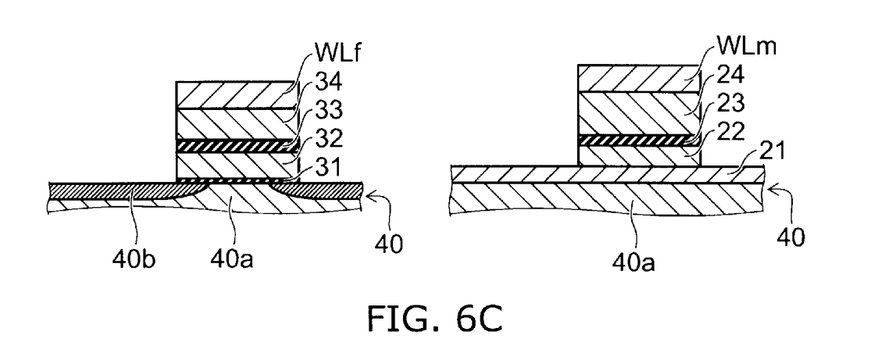

Next, as shown in FIG. 6C, the resist mask 70 is removed.

The removal of the resist mask 70 can be performed using, for example, the dry ashing method, the wet ashing method, or the like.

Figure 7A:
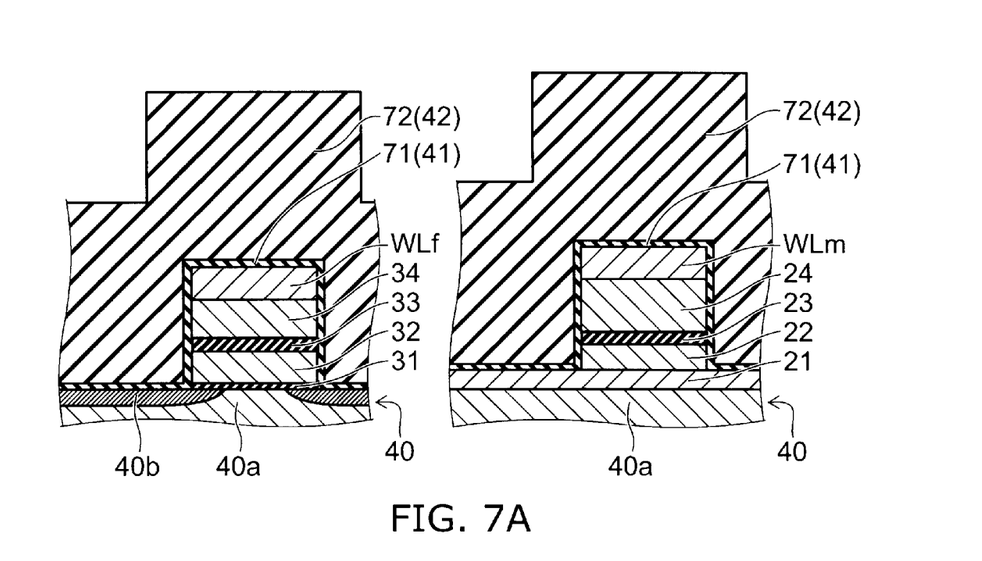
FIG. 7A and FIG. 7B are schematic process cross-sectional views for illustrating a method for manufacturing a nonvolatile memory device according to a second embodiment.

Next, as shown in FIG. 7A, a film 71 that forms the protection film 41 and a film 72 that forms the interlayer insulating film 42 are sequentially film-formed.

The film-formation of the film 71 and the film 72 can be performed using, for example, the CVD method or the like. The film 71 that forms the protection film 41 can be formed by, for example, processing silicon nitride or the like into a film with a prescribed thickness.

The film 72 that forms the interlayer insulating film 42 can be formed by, for example, processing silicon oxide or the like into a film with a prescribed thickness.

Figure 7B:
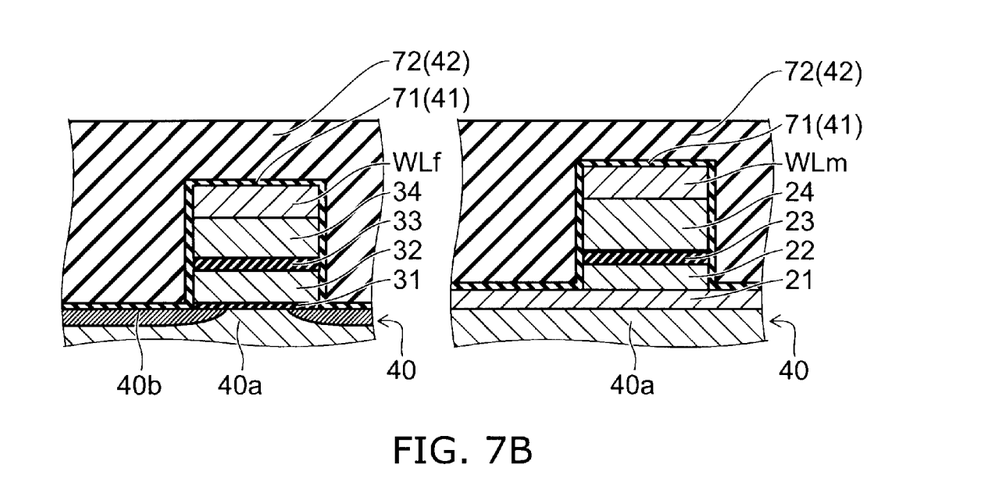

Next, as shown in FIG. 7B, the upper surface of the film 72 is planarized.

The planarization of the upper surface of the film 72 can be performed using, for example, the CMP (chemical mechanical polishing) method or the like.

Figure 8A:
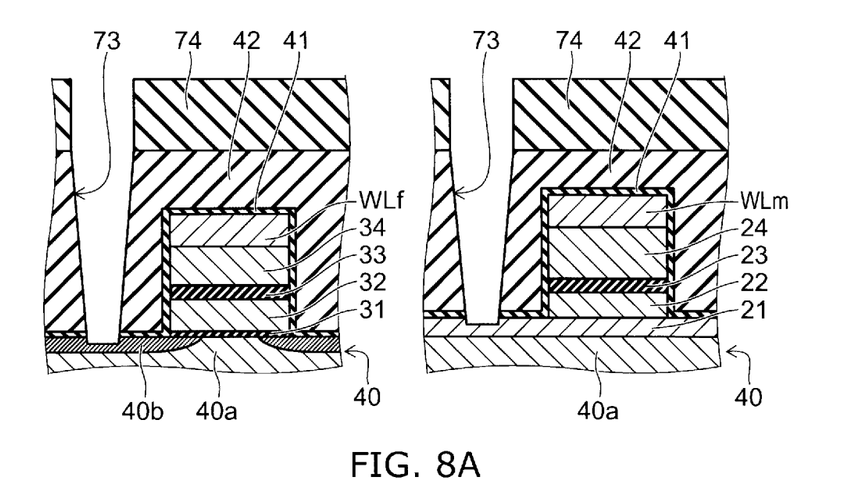
FIG. 8A and FIG. 8B are schematic process cross-sectional views for illustrating a method for manufacturing a nonvolatile memory device according to a second embodiment.

Next, as shown in FIG. 8A, contact holes 73 are formed in prescribed positions.

In this case, the contact hole 73 in the flash memory is formed so that the lower end thereof may reach the source/drain region 40b. The contact hole 73 in the spin injection MRAM is formed so that the lower end thereof may reach the conductive film 21.

The formation of the contact hole 73 can be performed using, for example, the PEP and the RIE method. "74" in FIG. 8A is a resist mask.

By forming the contact hole 73, the protection film 41 is formed from the film 71 and the interlayer insulating film 42 is formed from the film 72.

Figure 8B:
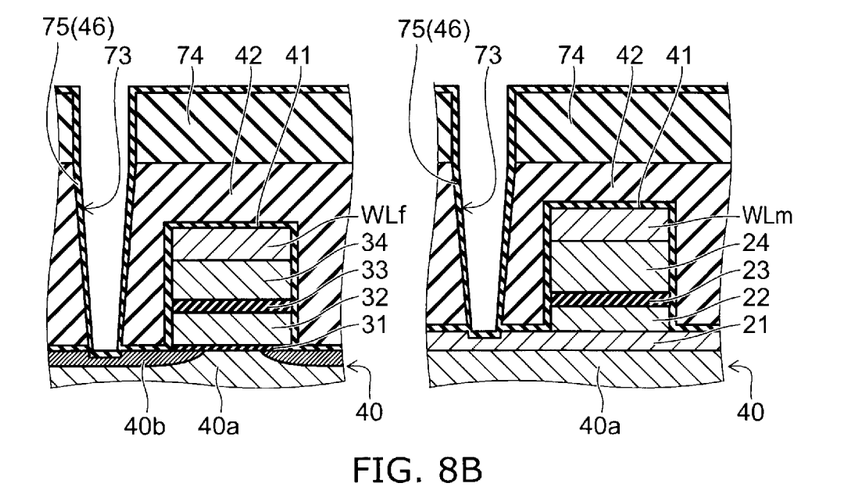

Next, as shown in FIG. 8B, a film 75 that forms the protection film 46 is film-formed on the inner surface of the contact hole 73.

The film 75 that forms the protection film 46 can be formed using, for example, the CVD method or the like to process silicon nitride or the like into a film with a prescribed thickness.

Figure 9A:
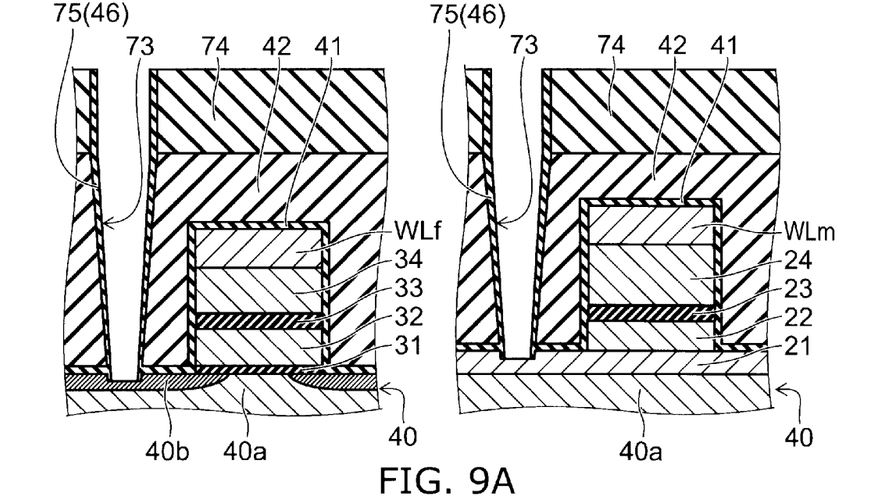
FIG. 9A and FIG. 9B are schematic process cross-sectional views for illustrating a method for manufacturing a nonvolatile memory device according to a second embodiment.

Next, as shown in FIG. 9A, the film 75 existing on the upper surface of the resist mask 74 and the film 75 existing on the bottom surface of the contact hole 73 are removed.

The removal of the films 75 existing on the upper surface of the resist mask 74 and the bottom surface of the contact hole 73 can be performed using, for example, the RIE method or the like.

Figure 9B:
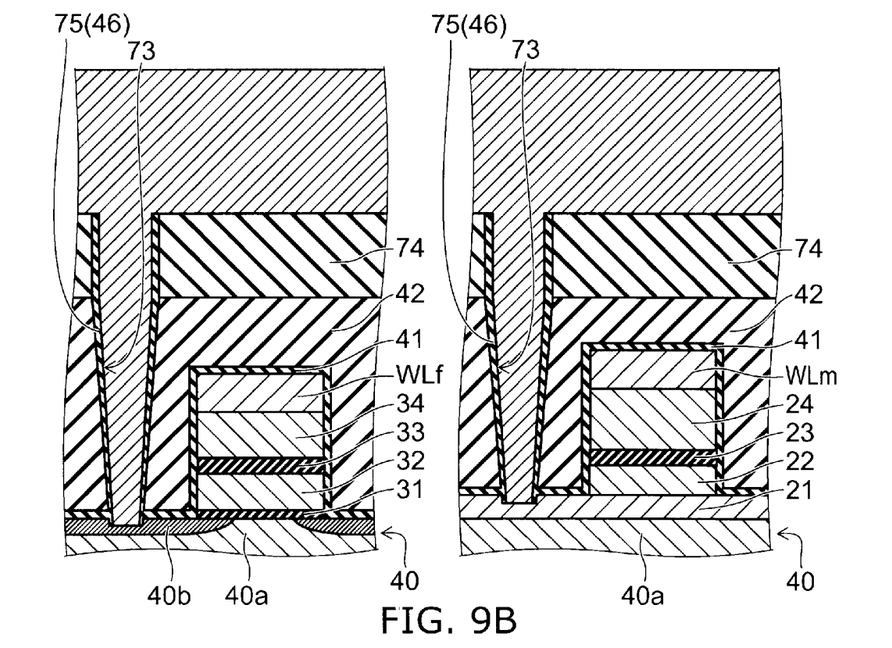

Next, as shown in FIG. 9B, the interior of the contact hole 73 is filled with a metal such as tungsten (W).

The filling of the interior of the contact hole 73 can be performed using, for example, the CVD method or the like.

Figure 10A:
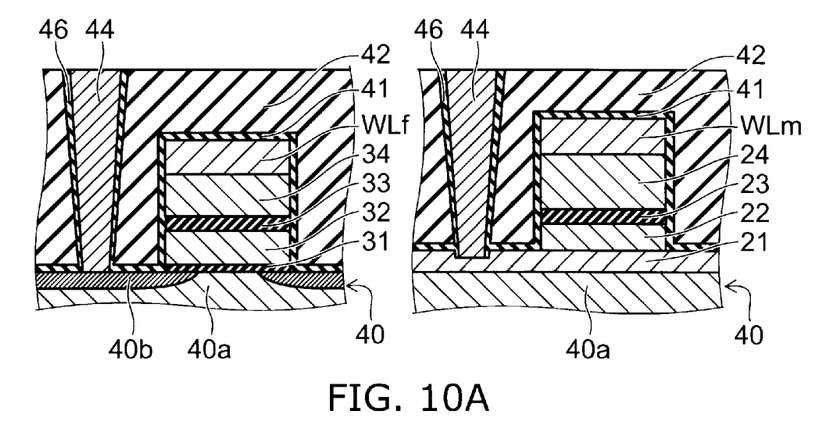
FIG. 10A and FIG. 10B are schematic process cross-sectional views for illustrating a method for manufacturing a nonvolatile memory device according to a second embodiment.

Next, as shown in FIG. 10A, the upper surface is planarized.

The planarization of the upper surface can be performed using, for example, the CMP method or the like.

In this case, the planarization is performed until the upper surface of the interlayer insulating film 42 becomes exposed, and the resist mask 74 and the surplus metal film-formed for filling the interior of the contact hole 73 are removed.

By performing such planarization, the protection film 46 is formed from the film 75 and the contact 44 is formed.

Figure 10B:
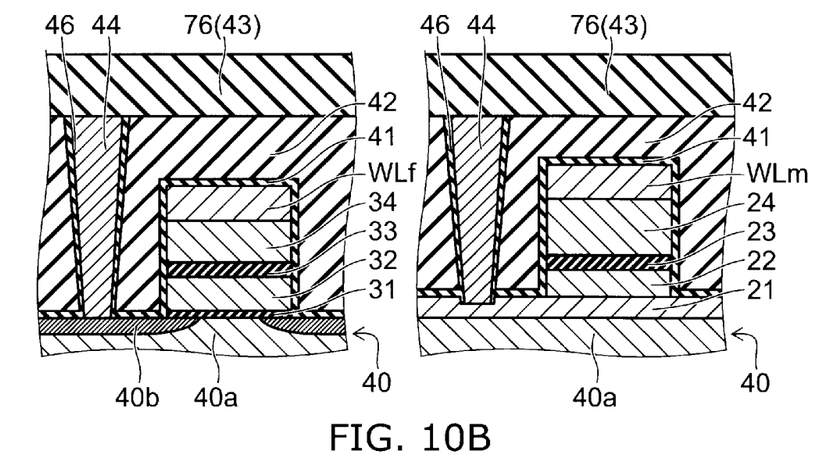

Next, as shown in FIG. 10B, a film 76 that forms the insulating film 43 is film-formed.

The film 76 that forms the insulating film 43 can be formed using, for example, the CVD method or the like to process silicon nitride or the like into a film with a prescribed thickness.

Figure 11A:
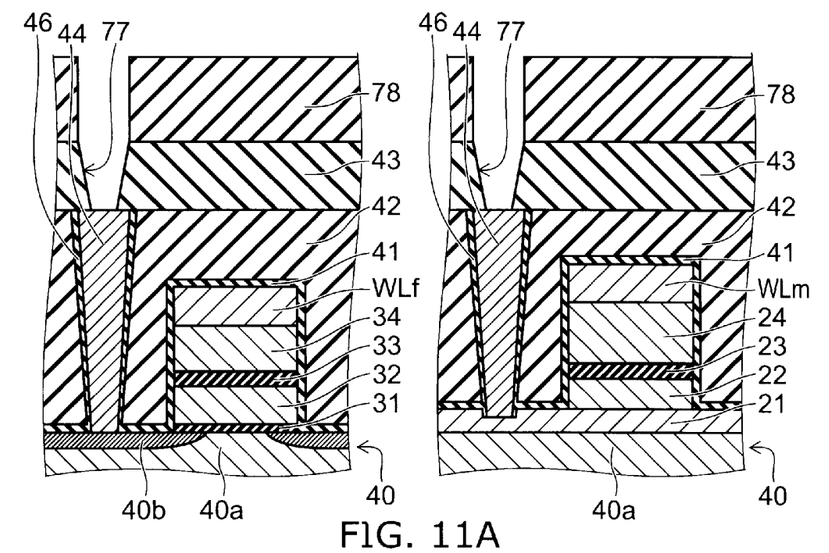
FIG. 11A and FIG. 11B are schematic process cross-sectional views for illustrating a method for manufacturing a nonvolatile memory device according to a second embodiment.

Next, as shown in FIG. 11A, contact holes 77 are formed in prescribed positions in the film 76.

In this case, the contact hole 77 is formed so that the lower end thereof may reach the upper end of the contact 44.

The formation of the contact hole 77 can be performed using, for example, the PEP and the RIE method. "78" in FIG. 11A is a resist mask.

By forming the contact hole 77, the insulating film 43 is formed from the film 76.

Figure 11B:
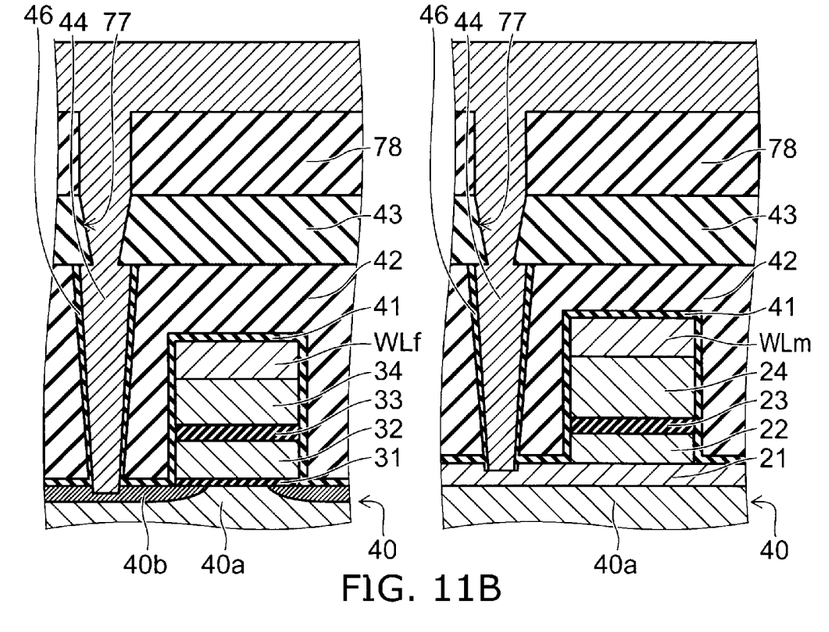

Next, as shown in FIG. 11B, the interior of the contact hole 77 is filled with a metal such as tungsten (W).

The filling of the interior of the contact hole 77 can be performed using, for example, the CVD method or the like.

Figure 12A:
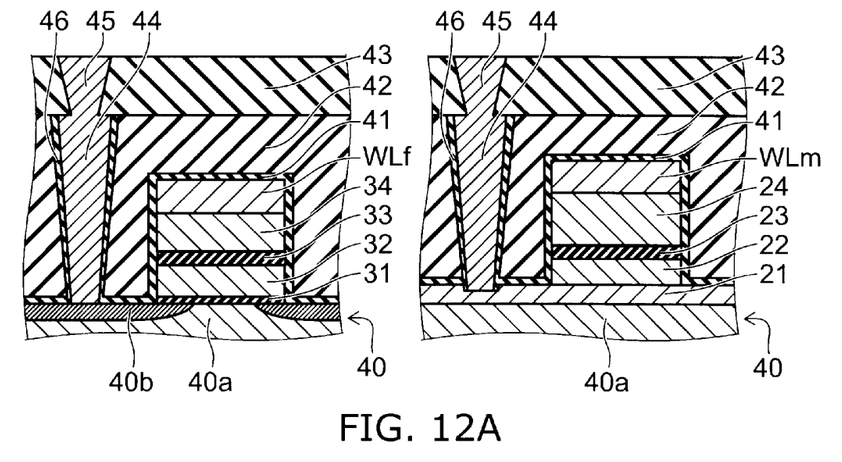
FIG. 12A and FIG. 12B are schematic process cross-sectional views for illustrating a method for manufacturing a nonvolatile memory device according to a second embodiment.

Next, as shown in FIG. 12A, the upper surface is planarized.

The planarization of the upper surface can be performed using, for example, the CMP method or the like.

In this case, the planarization is performed until the upper surface of the insulating film 43 becomes exposed, and the resist mask 78 and the surplus metal film-formed for filling the interior of the contact hole 77 are removed.

By performing such planarization, the contact 45 is formed.

Figure 12B:
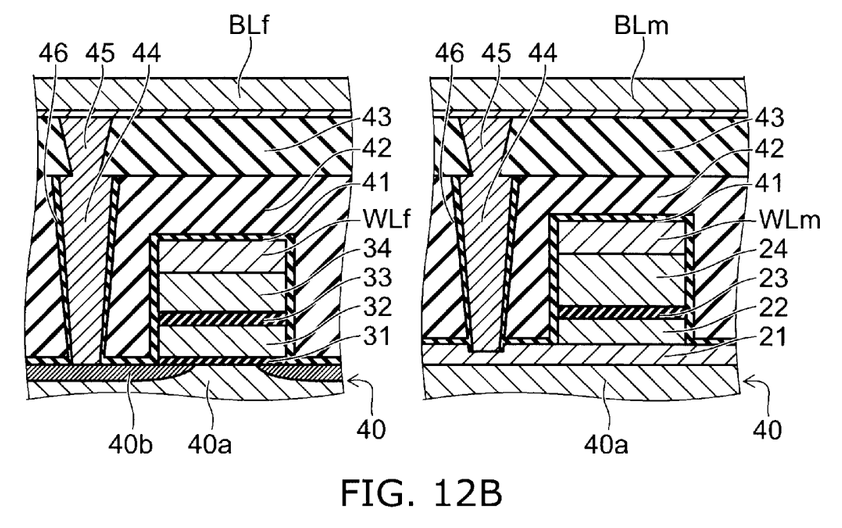

Next, as shown in FIG. 12B, bit lines are formed on the insulating film 43.

The bit line can be formed by, for example, processing a film using copper, tungsten, tungsten silicide, aluminum, or the like into a film with a prescribed thickness and using the PEP and the RIE method to form a desired configuration. At this time, the processing is performed so that the upper end of the contact 45 may be in contact with the lower surface of the bit line.

In this way, the bit line BLm in the spin injection MRAM and the bit line BLf in the flash memory are formed.

Thus, the nonvolatile memory device 1 including the spin injection MRAM that is the first memory unit 2 and the flash memory that is the second memory unit 3 is manufactured.

By the method for manufacturing a nonvolatile memory device according to this embodiment, since the data erase temperature is made high, the first memory unit 2 and the second memory unit 3 can be manufactured almost simultaneously even if the configuration of the first memory unit 2 and the configuration of the second memory unit 3 are different. Therefore, the productivity can be improved.

The embodiments illustrated above can provide a nonvolatile memory device with a high data erase temperature and high productivity and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

For example, although the case where the first memory unit 2 is an MRAM and the second memory unit 3 is a flash memory is illustrated, these components are not limited thereto. For example, in the case where an MRAM is used as the first memory unit 2, the second memory unit 3 may be a charge storage nonvolatile memory element, a current programming magnetoresistive effect memory, a high heat resistance ReRAM, or the like having a data erase temperature higher than the data erase temperature of the first memory unit 2.

What is claimed is:

1. A nonvolatile memory device, comprising:
a first memory unit; and
a second memory unit having a data erase temperature higher than a data erase temperature of the first memory unit,
the first memory unit being a spin injection MRAM, wherein
the first memory unit includes a first magnetic layer, a second magnetic layer, and a nonmagnetic layer placed between the first magnetic layer and the second magnetic layer, and
the first magnetic layer and the second magnetic layer are a stacked layer of a layer using TbCoFe and a layer using CoFeB.

2. The device according to claim 1, wherein the layer using CoFeB is provided on the nonmagnetic layer side in the first magnetic layer and the second magnetic layer.

3. The device according to claim 1, wherein the nonmagnetic layer is a layer using magnesium oxide.

4. A nonvolatile memory device, comprising:
a first memory unit; and
a second memory unit having a data erase temperature higher than a data erase temperature of the first memory unit,
the first memory unit being a spin injection MRAM, wherein
the first memory unit includes a first magnetic layer, a second magnetic layer, and a nonmagnetic layer placed between the first magnetic layer and the second magnetic layer, and
the second memory unit is one of:
an MRAM using perpendicular magnetization, and the first magnetic layer and the second magnetic layer are a layer using FePt, and
an MRAM using in-plane magnetization, and the first magnetic layer and the second magnetic layer are a layer using CoFe.

5. A nonvolatile memory device, comprising:
a first memory unit; and a second memory unit having a data erase temperature higher than a data erase temperature of the first memory unit, the first memory unit being a spin injection MRAM, wherein the first memory unit is a main memory storing information and allowing the stored information to be read out, and the second memory unit is a supplementary memory storing position information of a defective bit in the first memory unit.

6. The device according to claim 5, wherein a defective bit identified based on the position information of the defective bit stored in the second memory unit is prohibited from being used in the first memory unit.

* * * * *